(12) United States Patent
Ravener et al.

(10) Patent No.: US 10,249,747 B2
(45) Date of Patent: Apr. 2, 2019

(54) TURN-OFF POWER SEMICONDUCTOR DEVICE WITH IMPROVED CENTERING AND FIXING OF A GATE RING, AND METHOD FOR MANUFACTURING THE SAME

(71) Applicant: ABB Schweiz AG, Baden (CH)

(72) Inventors: Hendrik Ravener, Remigen (CH);
Tobias Wikström, Egliswil (CH);
Hermann Amstutz, Mellingen (CH);
Norbert Meier, Würenlingen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/290,377

(22) Filed: Oct. 11, 2016

(65) Prior Publication Data
US 2017/0033208 A1     Feb. 2, 2017

Related U.S. Application Data

(63) Continuation of application No. PCT/EP2015/053697, filed on Feb. 23, 2015.

(30) Foreign Application Priority Data

Apr. 10, 2014   (EP) .................................... 14164195

(51) Int. Cl.
*H01L 21/00*     (2006.01)
*H01L 29/745*    (2006.01)
(Continued)

(52) U.S. Cl.
CPC .......... *H01L 29/745* (2013.01); *H01L 21/565* (2013.01); *H01L 23/051* (2013.01);
(Continued)

(58) Field of Classification Search
CPC . H01L 29/745; H01L 23/051; H01L 23/3185; H01L 29/7424; H01L 29/45;
(Continued)

(56) References Cited

U.S. PATENT DOCUMENTS

| 4,370,180 A * | 1/1983 | Azuma ................. H01L 21/221 |
| | | 257/E21.137 |
| 4,719,500 A * | 1/1988 | Tokunoh ............... H01L 23/051 |
| | | 257/182 |

(Continued)

FOREIGN PATENT DOCUMENTS

JP        H07-312420        11/1995

OTHER PUBLICATIONS

European Patent Office, International Search Report & Written Opinion issued in corresponding Application No. PCT/EP2015/053697, dated Jun. 9, 2015, 10 pp.

(Continued)

*Primary Examiner* — Charles D Garber
*Assistant Examiner* — Abdulfattah B Mustapha
(74) *Attorney, Agent, or Firm* — J. Bruce Schelkopf; Taft Stettinius & Hollister LLP

(57) ABSTRACT

The present application relates to a turn-off power semiconductor device having a wafer with an active region and a termination region surrounding the active region, a rubber ring as an edge passivation for the wafer and a gate ring placed on a ring-shaped gate contact on the termination region for contacting the gate electrodes of a thyristor cell formed in the active region of the wafer. In the turn-off power semiconductor device, the outer circumferential surface of the gate ring is in contact with the rubber ring to define the inner border of the rubber ring. The area consumed by the ring-shaped gate contact on the termination or edge region can be minimized. The upper surface of the gate (Continued)

ring and the upper surface of the rubber ring form a continuous surface extending in a plane parallel to the first main side of the wafer.

20 Claims, 7 Drawing Sheets

(51) Int. Cl.
      *H01L 23/051*    (2006.01)
      *H01L 23/31*     (2006.01)
      *H01L 29/74*     (2006.01)
      *H01L 29/744*    (2006.01)
      *H01L 21/56*     (2006.01)
      *H01L 29/45*     (2006.01)
      *H01L 29/66*     (2006.01)

(52) U.S. Cl.
     CPC .......... *H01L 23/3185* (2013.01); *H01L 29/45* (2013.01); *H01L 29/66363* (2013.01); *H01L 29/744* (2013.01); *H01L 29/7416* (2013.01); *H01L 29/7424* (2013.01); *H01L 2924/0002* (2013.01)

(58) Field of Classification Search
     CPC ............. H01L 29/66363; H01L 21/565; H01L 29/7416; H01L 29/744; H01L 2924/0002
     See application file for complete search history.

(56) References Cited

U.S. PATENT DOCUMENTS 5,633,536 A     5/1997   Nakashima et al.
6,303,987 B1   10/2001   Kawamura et al.
2009/0096503 A1   4/2009   Koellensperger et al.

OTHER PUBLICATIONS

European Patent Office, Extended Search Report issued in corresponding Application No. 14164195.1, dated Oct. 16, 2014, 6 pp.

* cited by examiner

TURN-OFF POWER SEMICONDUCTOR DEVICE WITH IMPROVED CENTERING AND FIXING OF A GATE RING, AND METHOD FOR MANUFACTURING THE SAME

FIELD OF THE INVENTION

The present invention relates to a turn-off power semiconductor device according to the preamble of claim 1, as well as to a method for manufacturing such turn-off power semiconductor device.

BACKGROUND OF THE INVENTION

From US 2009/096503 A1 there is known a gate turn-off thyristor (GTO), wherein the gate electrode of a substrate is contacted by a ring-shaped contact element. A ring-shaped passivation member is arranged at the edge of the semiconductor substrate surrounding the ring-shaped gate contact element.

From JP 07-312420 A there is known a gate turn-off thyristor (GTO), wherein a pin-shaped ring gate frame electrode is welded on a gate electrode surface of the semiconductor device. Insulating coating material is covering the edge of the semiconductor device.

From U.S. Pat. No. 4,370,180 there is known a gate turn-off thyristor (GTO), wherein the periphery of a substrate is encapsulated by silicon rubber for passivation.

Known prior art turn-off power semiconductor devices include a gate turn-off thyristor (GTO) and an integrated gate-commutated thyristor (IGCT). A known turn-off power semiconductor device comprises a wafer having a first main side, a second main side parallel to the first main side and extending in a lateral direction, an active region and a termination region laterally surrounding the active region. In the active region there are provided a plurality of thyristor cells between the first main side and the second main side. Each of the thyristor cells comprises in the order from the first main side to the second main side a cathode electrode, a n-type cathode semiconductor layer, a p-type base semiconductor layer, a n-type drift semiconductor layer, a p-type anode semiconductor layer and an anode electrode. Each thyristor cell further comprises a gate electrode which is arranged lateral to the cathode semiconductor layer and contacting the base semiconductor layer. The gate electrodes are implemented as a gate metallization layer electrically connected to a ring-shaped gate contact for connecting all gate electrodes of the plurality of thyristor cells to a control circuit. In a known turn-off power semiconductor device, the ring-shaped gate contact is formed on the first main side of the wafer in the termination region and surrounds the active region.

As an edge passivation, the known turn-off power semiconductor device further comprises a rubber ring arranged on the termination region and surrounding the active region. An electrically conductive gate ring for contacting the ring-shaped gate contact from outside is disposed on and electrically connected to the ring-shaped contact within the rubber ring.

It is also known a turn-off power semiconductor device with an inner ring-shaped gate contact which is not located on the termination region or outer edge region of the wafer but at an inner region of the wafer. Herein, the terms "outer" and "inner" relate to the distance from the center of the wafer in a plane parallel to the first main side of the wafer. The inner ring-shaped gate contact is formed as a ring with its center at the center of the wafer and a radius which is about half the radius of the wafer.

Regarding the device performance, the ring-shaped gate contact on the termination region of the wafer has the following advantages compared to the inner ring-shaped contact:

(i) The gate circuit including the gate leads connecting the gate ring to the control circuit can have a lower impedance.
(ii) A cathode pole piece, which is pressed onto the cathode electrodes of the plurality of thyristor cells for electrically connecting the cathode electrodes of the plurality of thyristor cells to a main current line, does not need to have any channels or feed throughs for the gate leads connecting the gate ring to the control circuit. That has the advantage that the pressure for pressing the cathode pole piece onto the cathode electrodes of the plurality of thyristor cells and also the cooling of the cathode pole piece can be made more homogeneous.)
(iii) In an IGCT where the wafer has an integrated free-wheeling diode, the ratio between the active area used for the thyristor cells and the area used for the integrated free-wheeling diode can be freely chosen between 0% and 100%.

On the other side, in the known turn-off power semiconductor device described above, the use of a ring-shaped gate contact which is placed on a termination region or edge region of the wafer has the disadvantage compared to an inner ring-shaped contact that it consumes more area of the wafer. The reason is that the width of the ring-shaped gate contact must be the same for both configurations. For example, for a 68 mm wafer, a 3 mm wide ring-shaped gate contact would consume 9% of the available wafer area with an inner ring-shaped gate contact placed at R/2 (where R is the radius of the wafer) but would consume 20% of the available wafer area when the ring-shaped gate contact is placed on the edge region of the wafer. That means that using the ring-shaped contact on the edge region consumes 11% more of the available wafer area.

In a known method for manufacturing the above described turn-off power semiconductor device, the rubber ring is first formed by molding before the gate ring is centered and fixed to the wafer.

Therefore, the tolerances of the rubber ring geometry and the tolerances of centering the gate ring relative to the wafer add up. For a 68 mm wafer these tolerances can add up to 1 mm in diameter. The tolerance for the rubber ring geometry is mainly inherent to the known molding process which uses perfluoroalkoxy alkanes (PFA) as a coating of the mold. Coating the molding forms with PFA has an inherent tolerance. In addition the mold and fixtures are heated to reduce cycle time and the dimensions of the mold and of the fixtures depend on the temperature.

To compensate these tolerances, the width of the ring-shaped gate contact has to be increased. In case that the width of the ring-shaped gate contact is increased by 1 mm for a 68 mm wafer, 8% of the available wafer area is consumed with a ring-shaped gate contact placed at the edge of the wafer but only 3% of the available wafer area is consumed with an inner ring-shaped gate contact.

In order to maximise the active area in a device with the ring-shaped gate contact at the edge of the wafer, the gate ring has to be placed as close to the rubber ring as possible. This involves the risk that a part of the contact area of the gate ring, which is intended to be pressed onto the ring-shaped gate contact, is rather pressed onto the rubber ring instead of being pressed onto the ring-shaped gate contact. This can result in breakage of the wafer, damage of the rubber ring or electrical failure (inhomogeneous contact between the gate ring and the ring-shaped gate contact).

SUMMARY OF THE INVENTION

It is the object of the invention to minimize the area consumed by a ring-shaped contact on the termination or edge region of a wafer for contacting the gate electrodes of at least one thyristor cell in a turn-off power semiconductor device in a reliable manner.

The object is attained by a turn-off power semiconductor device according to claim 1 and by a method for manufacturing such turn-off power semiconductor device according to claim 7.

In the turn-off power semiconductor device according to claim 1, the outer circumferential surface of the gate ring is in contact with the rubber ring to define the inner border of the rubber ring. Herein, the terms "outer" and "inner" relate to the distance from the center of the wafer in a plane parallel to the first main side of the wafer. Specifically, the outer circumferential surface of the gate ring is that portion of the surface of the gate ring which faces away from the center of the wafer in a direction parallel to the first main side. The inner border of the rubber ring is the border towards the center of the wafer in all planes parallel to the first main side.

Accordingly, the active area of the device is maximised because there is no tolerance for the distance between gate ring and rubber ring anymore. Further, the turn-off power semiconductor device according to claim 1 has the advantage that there is no danger that the rubber ring is pressed by a contact area of the gate ring due to bad centering of the gate ring relative to the wafer because the gate ring defines the inner border of the rubber ring.

Further developments of the invention are specified in the dependent claims.

In a preferred embodiment, the rubber ring overlaps with an outer portion of the ring-shaped contact. This preferred embodiment has the advantage that it can ensure a reliable contact of the gate ring to the ring-shaped contact.

In another preferred embodiment, the rubber ring has an outer diameter which is larger than the diameter of the wafer and covers a circumferential side surface of the wafer, which connects the first main side to the second main side. This feature has the advantage that the rubber ring provides an effective edge passivation of the wafer.

In the method for manufacturing the turn-off power semiconductor device of the invention according to claim 7, the gate ring is used as an inner sidewall of a mold during a molding step for molding the rubber ring. In this way the inner border of the rubber ring can be reliably defined by the gate ring.

In a preferred embodiment of the method for manufacturing the turn-off power semiconductor device of the invention the gate ring is centered to the wafer by a gate ring centering guide before the molding step, and the mold comprises a top mold part and a bottom mold part, wherein the gate ring centering guide is part of the top mold part. This preferred embodiment allows reliable and efficient centering of the gate ring and of the rubber ring relative to the wafer.

In another preferred embodiment of the method for manufacturing the turn-off power semiconductor device of the invention the gate ring is fixed to the ring-shaped contact by a bonding technique before the molding step. That preferred embodiment has the advantage that no gap can be formed between the contact area of the gate ring and the ring-shaped contact and, therefore, during the molding process no liquid rubber can get under the contact area of the gate ring. In this way the electrical contact between the gate ring and the ring-shaped contact can be made more reliably.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 1:
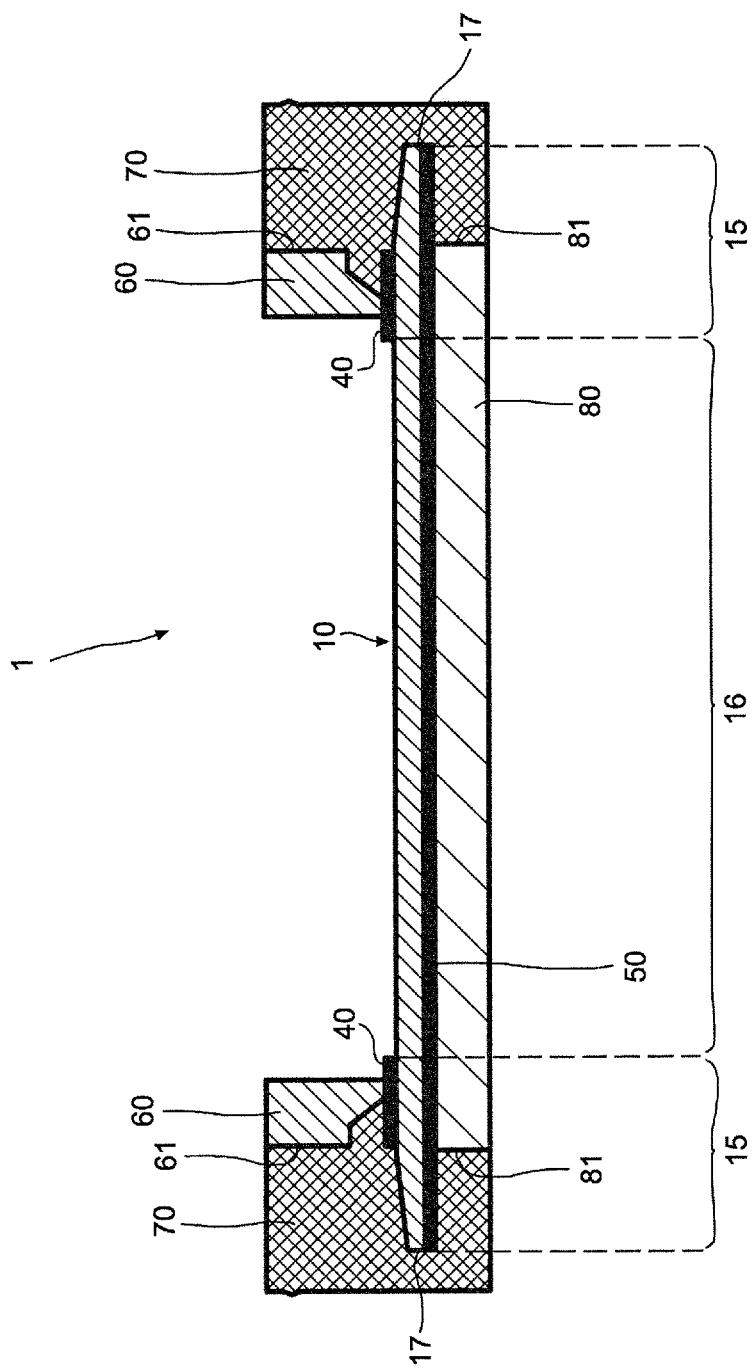
FIG. 1 is a cross section of the turn-off power semiconductor device according to a first embodiment of the invention.

The turn-off power semiconductor device according to a first embodiment of the invention shown in FIG. 1 in cross section is a reverse conducting integrated gate-commutated thyristor (RC-IGCT) 1 comprising a wafer 10, an electrically conductive gate ring 60 and a rubber ring 70. As can be seen best in FIG. 2A, which shows a cross section of the wafer 10 along line AA' in FIG. 2B, the wafer 10 has a first main side 11 and a second main side 12 which is parallel to the first main side 11 and extends in a lateral direction. The wafer comprises an active region 16 (inner region) and a termination region (edge region) 15 surrounding the active region 16. In the active region 16 of the wafer 10 there are provided a plurality ofthyristor cells 2 and a single free-wheeling diode 3 between the first main side 11 and the second main side 12.

Each thyristor cell 2 comprises from the first main side 11 to the second main side 12 of the wafer 10 a first cathode electrode 21, a n$^+$-doped cathode semiconductor layer 22, a p-doped base semiconductor layer 23, a n$^-$-doped drift semiconductor layer 24, exemplarily a buffer semiconductor layer 25, a p+-doped first anode semiconductor layer 26 and a first anode electrode 27. Therein, the buffer semiconductor layer 25 has a rising doping concentration towards the second main side 12, whereas the drift semiconductor layer 24 has approximately a constant doping concentration.

Further, each thyristor cell 2 has a gate electrode 20 which is arranged on the first main side 11 of the wafer 10 lateral to the cathode semiconductor layer 22 and contacting the base semiconductor layer 23, but separated from the first cathode electrode 21 and the cathode semiconductor layer 22. Therein, the term "lateral" relates to the position in a lateral direction which is a direction parallel to the first main side 11.

Figure 2A:
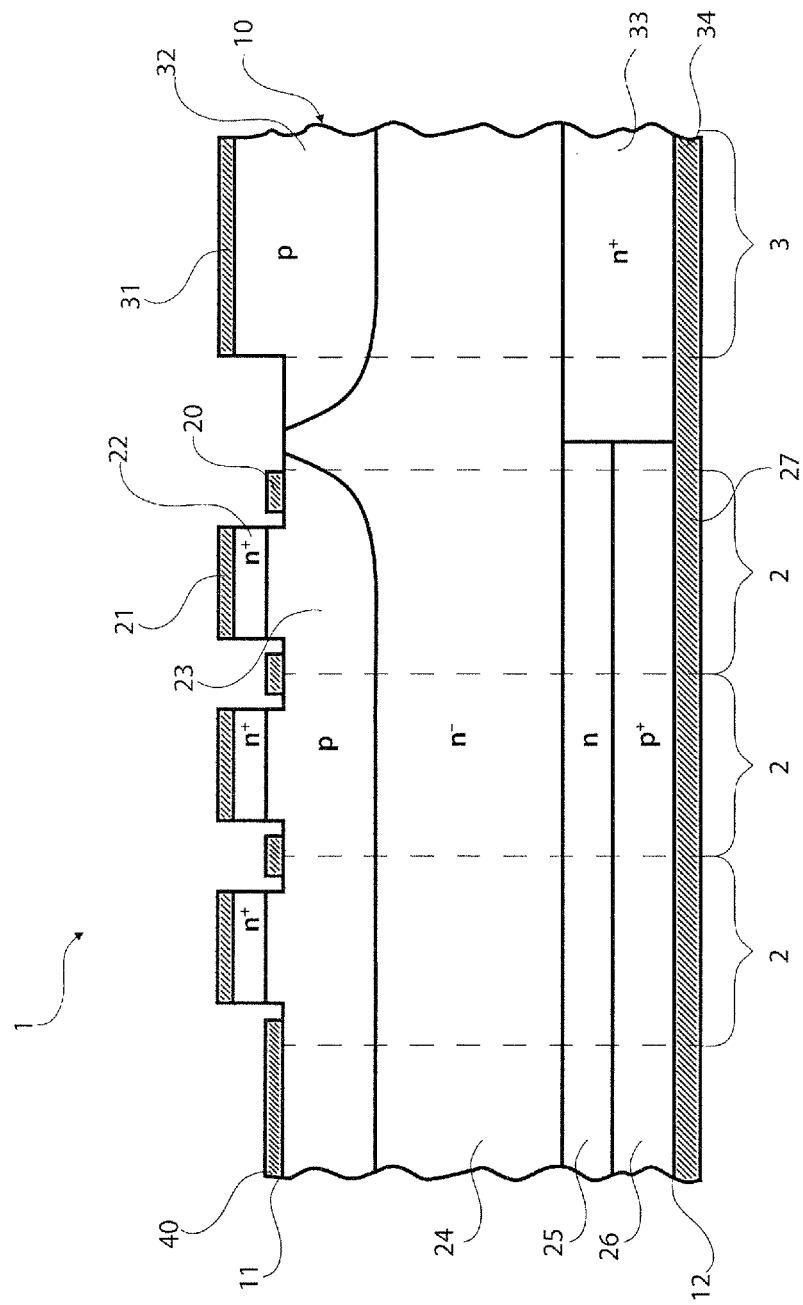
FIG. 2A is a cross section of a portion of a wafer of the turn-off power semiconductor device according to the first embodiment of the invention shown in FIG. 1 along a line AA' in FIG. 2B.

In the center C of the exemplarily circular wafer 10 there is arranged the integrated single free-wheeling diode 3, a cross section of which (along the line AA' in FIG. 2B) can also be seen in FIG. 2A. The free-wheeling diode 3 comprises from the first main side 11 to the second main side 12 of the wafer 10 a second anode electrode 31, a p-doped second anode semiconductor layer 32, a n+-doped second cathode semiconductor layer 33, which is separated from the p-doped second anode semiconductor layer 32 by the n−-doped drift semiconductor layer 24, and a second cathode electrode 34.

Figure 2B:
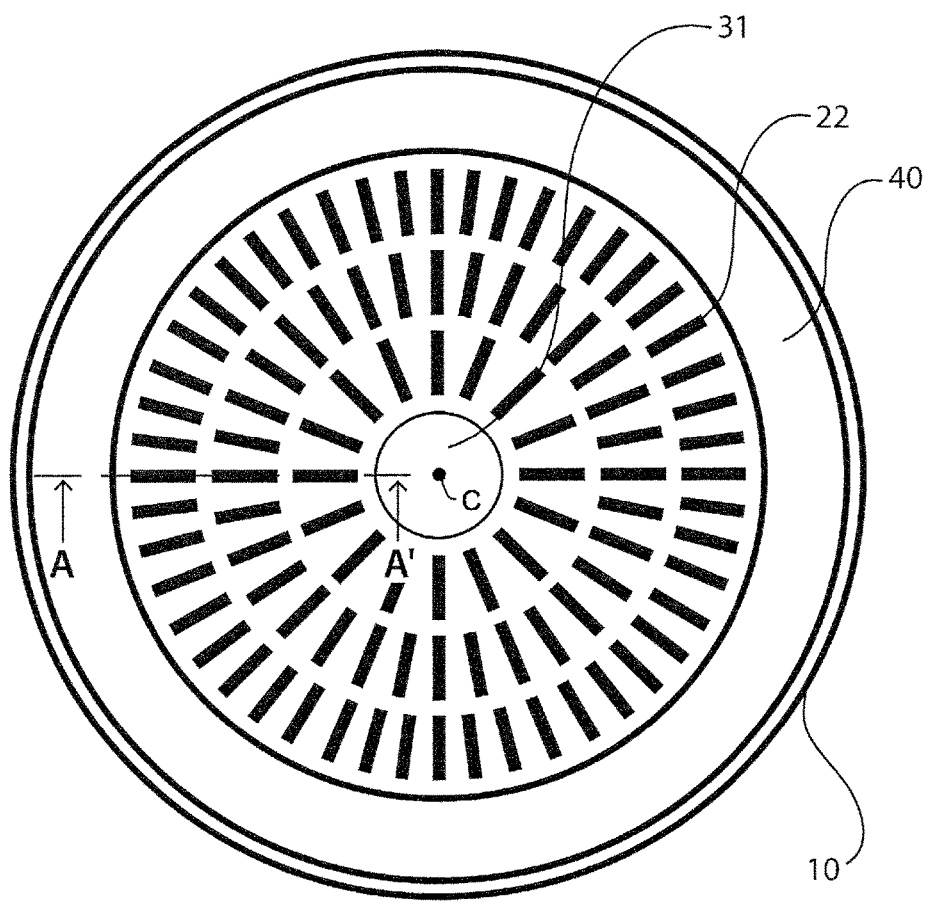
FIG. 2B is a top view onto the first main side of the wafer of the turn-off power semiconductor device shown in FIG. 1.

The arrangement of the plurality of thyristor cells 2 in the RC-IGCT 1 can be seen in FIG. 2B, which shows a top view onto the first main side 11 of the wafer 10. The cathode semiconductor layers 22 of the RC-IGCT 1 are formed in the shape of strips with its longitudinal direction aligned in radial direction, which is a direction extending from the center C of the wafer 10 and parallel to the first main side 11 of the wafer 10. Further, strips shall be understood as layers, which have in one direction, which is their longitudinal direction, a longer extension than in the other directions by having two longer sides, which are typically arranged parallel to each other. The plurality of strip-shaped cathode semiconductor layers 22 are arranged in concentric rings around the center of the wafer 10. On the termination region 15 of the wafer 10 there is arranged a ring-shaped contact 40 to which all gate electrodes 20 of the plurality of thyristor cells 2 are electrically connected. The gate electrodes 20 of the thyristor cells 2, the ring-shaped contact 40 and the connections there between are implemented as a gate metallization layer surrounding all the cathode semiconductor layers 22.

Also, the upper side of the gate metallization layer is on a level lower than the upper side of the first cathode electrodes 21 of the plurality of thyristor cells 2 when the first main side 11 is seen as an upper side of the device and the second main side 12 is seen as a lower side of the device.

The rubber ring 70 shown in FIG. 1 is arranged on the termination region 15 of the wafer 10 and surrounds the active region 16 of the device 1. The gate ring 60 for contacting the ring-shaped contact 40 from outside is disposed on and electrically connected to the ring-shaped contact 40 within the rubber ring 70. Further, the gate ring 60 is preferably fixed to the ring-shaped contact 40 by a bonding connection. An outer circumferential surface 61 of the gate ring 60 is in contact with the rubber ring 70 to define the inner border of the rubber ring 70. Preferably, the rubber ring 60 is fixed to the gate ring 70 by being molded to the outer circumferential surface of the gate ring 60. As can be seen in FIG. 1, the rubber ring 70 overlaps with an outer portion of the ring-shaped contact 40 in an orthogonal projection onto the first main side 11 of the wafer 10. The upper surface of the gate ring 60 and an upper surface of the rubber ring 70 form a continuous surface extending in a plane parallel to the first main side 11 of the wafer 10. Therein, the upper surfaces of the gate ring 60 and of the rubber ring 70 are surfaces which face away from the first main side of the wafer 10.

The first anode electrodes 27 of the plurality of thyristor cells 2 and the second cathode electrode 34 of the free-wheeling diode 3 are implemented as a metallization layer 50 formed on the second main side 12 of the wafer 10. An anode disk 80 made of molybdenum or an molybdenum copper alloy is fixed to the metallization layer 50 by a bonding connection (such as low temperature bonding, soldering, gluing or the like) to be in electrical contact with the metallization layer 50. Therefore, the anode disk 80 is in electrical contact with the first anode electrodes 27 of the plurality of thyristor cells 2 and with the second cathode electrode 34 of the free wheeling diode 3. The outer side surface 81 of the anode disk 80 is covered by the rubber ring 70. Further, the rubber ring 70 has an outer diameter which is larger than the diameter of the wafer 10 and covers a circumferential side surface 17 of the wafer 10, which connects the first main side 11 to the second main side 12.

Figure 3:
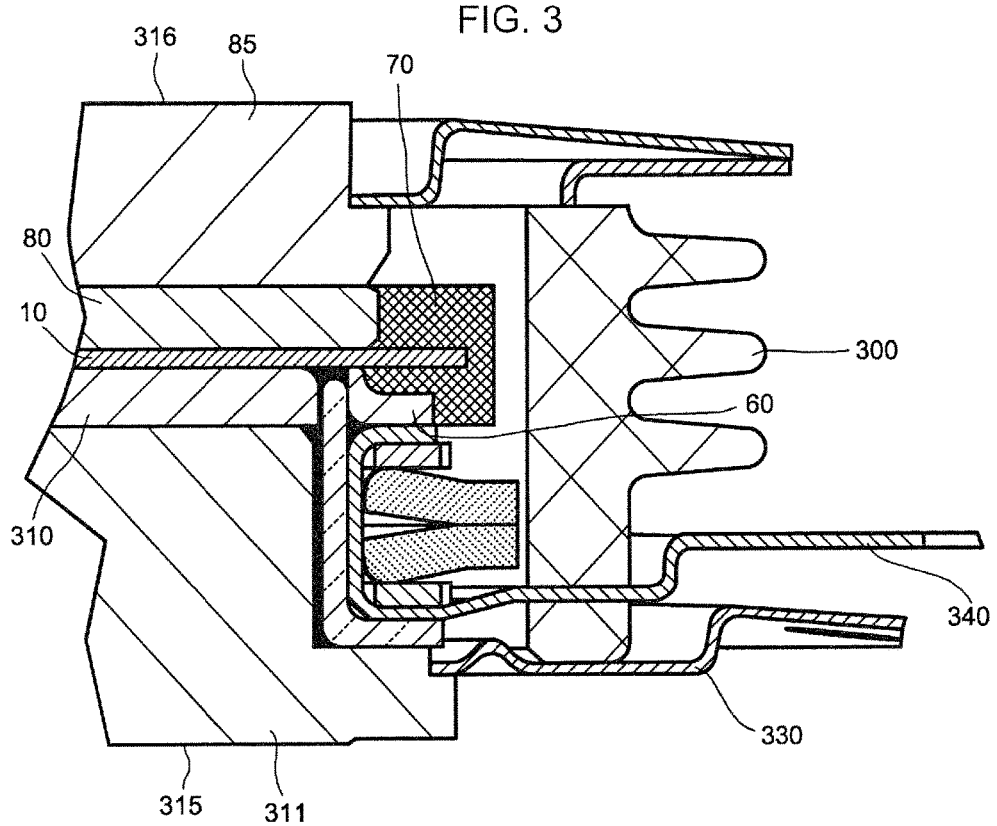
FIG. 3 is a cross section of an edge portion of the turn-off power semiconductor device of FIG. 1 in a state in which it is housed in a ceramic housing.

In FIG. 3 there is shown a cross section of the edge portion of the turn-off power semiconductor device 1 when being mounted in a ceramic housing 300. A cathode contact disk 310 which is made from molybdenum or an alloy comprising molybdenum and another metal, exemplarily a molybdenum copper alloy like the anode disk 80 is pressed onto the first main side 11 of the wafer 10 to contact the first cathode electrodes 21 of the plurality of thyristor cells 2 and the second anode electrode 31 of the free-wheeling diode 3. Through the cathode pole-piece 311, the cathode contact disk 310 is electrically connected to a main cathode contact 315 accessible to the outside, as well as to the cathode port of a gate control circuit (not shown in the drawings) through the auxiliary cathode lead 330. Through the anode pole-piece 85 the anode disk 80 is electrically connected to a main anode contact 316 accessible to the outside, The gate ring 60 is electrically connected to a gate lead 340, which connects the gate ring 60 to the gate port of the gate control circuit (not shown in the drawings), trough a feed through in the ceramic housing 300.

Next there will be described with reference to FIG. 4 and FIG. 5 a method for manufacturing the turn-off power semiconductor device according to the first embodiment of the invention.

In the method for manufacturing the turn-off power semiconductor device according to the first embodiment of the invention, the gate ring 70 is molded by injection molding. As shown in FIG. 5, a mold for molding the rubber ring 70 comprises a top mold part 410, a cylindrical mold part 420 which is the outer side wall of the mold, and a bottom mold part 430. Therein, the cylindrical mold part 420 can be either a separate part, which is separate from the top mold part 410 and separate from the bottom mold part 430, or it can be an integrated portion of the top mold part 410 or of the bottom mold part 430. As describe later the gate ring 60 will be used as an inner sidewall of the mold. The top mold part 410, the cylindrical mold part 420 and the bottom mold part 430 are coated with PFA (perfluoroalkoxy alkane).

Before a step of molding the rubber ring 70 is performed, the anode disk 80 is bonded to the metallization layer 50 of the wafer 10 by a bonding technique which can provide an electrical connection between the metallization layer 50 and the electrically conductive anode disk 80.

Thereafter, the gate ring 60 is centered relative to the wafer 10 by a centering guide.

The centering guide can be either a separate part or be an integrated portion of the upper mold part 410. When the gate ring 60 is centered relative to the wafer 10, then it is fixed to the wafer by a bonding technique such as low temperature bonding, soldering or gluing, wherein the bonding technique provides an electrical connection between the gate ring 60 and the ring-shaped contact 40.

In a subsequent step of the method, the wafer 10 including the gate ring 60 and the anode disk 80 is installed in the mold including the top mold part 410, the cylindrical mold part 420 and the bottom mold part 430. Therein, vacuum gripping 460 is used to fix the wafer 10 relative to the mold.

Figure 4:
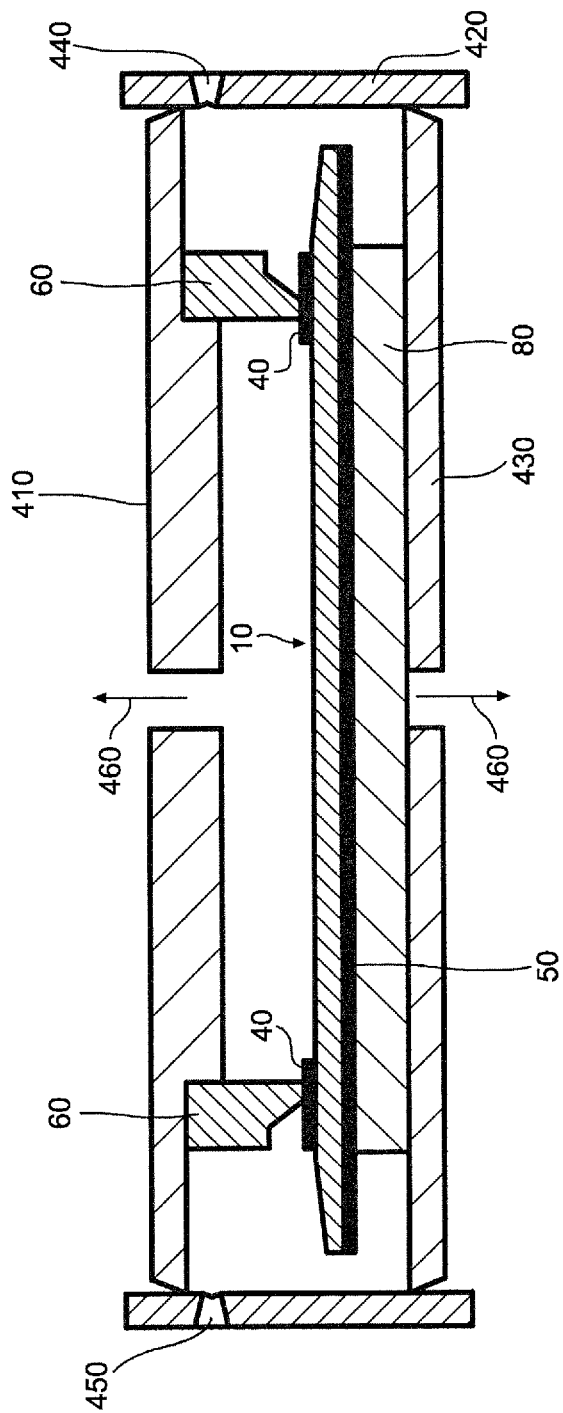
FIG. 4 is a cross sectional view illustrating the mold for molding a rubber ring at the edge of a wafer before injection of liquid rubber into the mold in a method for manufacturing the turn-off power semiconductor device according to the first embodiment of the invention.
Figure 5:
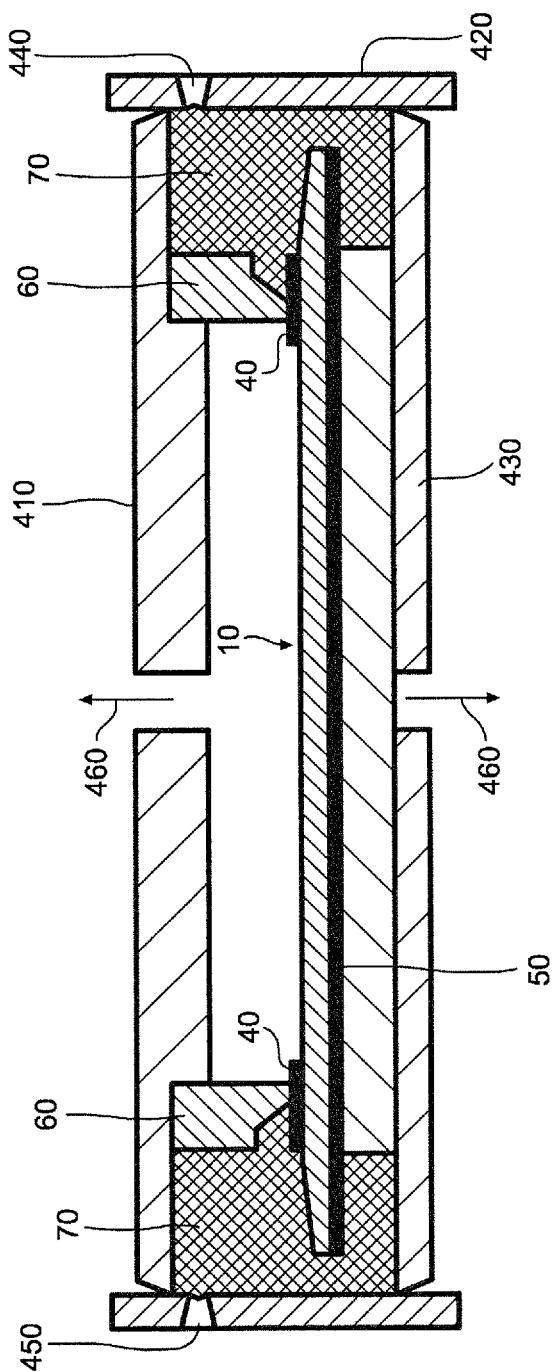
FIG. 5 is a cross sectional view illustrating the mold for molding a rubber ring after injection of liquid rubber into the mold in a method for manufacturing a turn-off power semiconductor device according to the first embodiment of the invention.

As shown in FIG. 4, the gate ring 60 is used as an inner sidewall of the mold for molding the rubber ring 70. As a next step, liquid rubber is injected through an inlet opening 440 in the cylindrical mold part. A silicone rubber can be used for molding the rubber ring 70. While the liquid rubber is injected through the inlet opening 440, air in the mold can exit from the mold through an outlet opening 450 in the cylindrical mold part 420. The liquid rubber is injected such that an upper surface of the gate ring 60 and an upper surface of the liquid rubber (i.e. rubber ring 70 after hardening) form a continuous surface extending in a plane parallel to the first main side 11 of the wafer 10. FIG. 5 shows the wafer 10 including the anode disk 80 and the gate ring 60 assembled with the top mold part 410, the cylindrical mold part 420 and the bottom mold part 430 after injection of liquid rubber into the mold. The negative shape of the rubber ring 70 is determined by upper mold part 410, the cylindrical mold part 420, the bottom mold part 430, the wafer 10, the anode disk 80 and the gate ring 60. During the molding step the upper mold part 410 and the bottom mold part 430 are pressed together to clamp the wafer 10, the gate ring 60 and the anode disk 80 between upper mold part 410 and the bottom mold part 430.

After hardening of the liquid rubber, the top mold part 410, the cylindrical mold part 420 and the bottom mold part 430 can be removed and manufacturing of the turn-off power semiconductor device according to the first embodiment as shown in FIG. 1 is finished.

Figure 6:
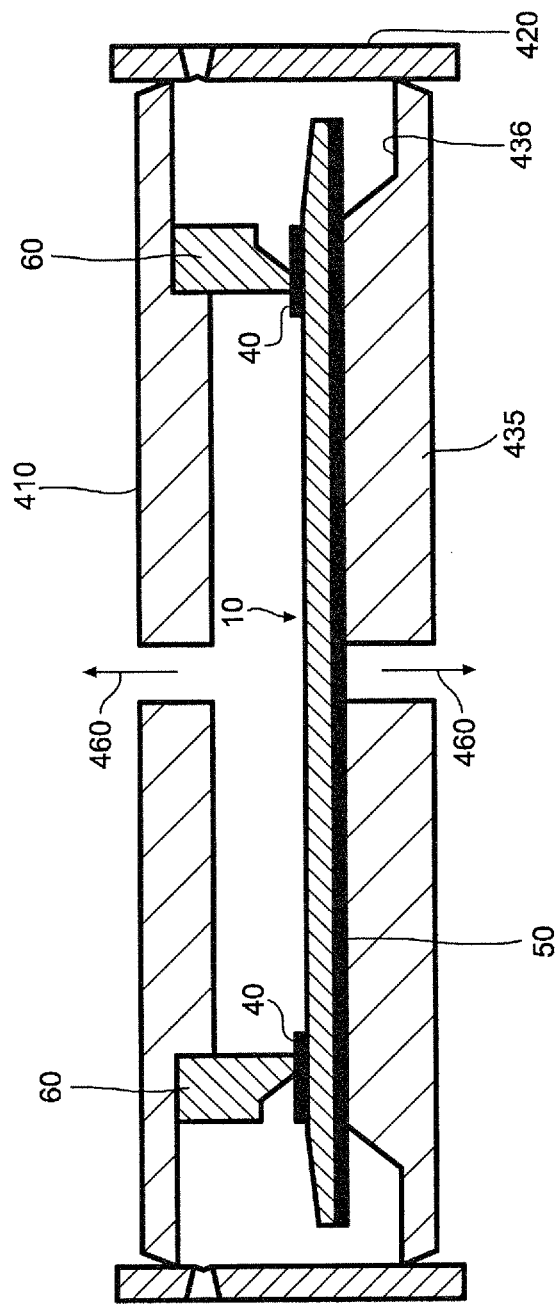
FIG. 6 is a cross sectional view illustrating the mold for molding a rubber ring at the edge of a wafer before injection of liquid rubber into the mold in a method for manufacturing a turn-off power semiconductor device according to a second embodiment of the invention.

Next there will be described a method for manufacturing a turn-off power semiconductor device according to a second embodiment of the invention with reference to FIG. 6, which is a cross sectional view illustrating the mold for molding a rubber ring at the edge of a wafer 10 before injection of liquid rubber into the mold, wherein the wafer 10 including the gate ring 60 is assembled to an upper mold part 410, a cylindrical mold part 420 and a bottom mold part 435. The method for manufacturing a turn-off power semiconductor device according to the second embodiment is very similar to the method described above with FIG. 4 and FIG. 5. Accordingly, only the differences to the above described method will be described in the following. In the method for manufacturing a turn-off power semiconductor device according to the second embodiment the anode disk 80 is not bonded to the wafer 10 before the molding step for molding the rubber ring 70. The bottom mold part 435 which is used in the method described with FIG. 6 differs from the bottom mold part 430 in that there is provided a recess 436 for forming the rubber ring also on the second main side of the wafer 10 in the edge region. Here, it is to be noted that the contact area of the bottom mold part with the wafer 10 has to overlap the contact area of the gate ring 60 with the wafer 10 in an orthogonal projection onto the first main side 11 of the wafer 10 to avoid breakage of the wafer when the gate ring is pressed onto the wafer 10 during molding.

It will be apparent for persons skilled in the art that modifications of the above described embodiments are possible without departing from the idea of the invention as defined by the appended claims.

The turn-off power semiconductor device of the invention was described to be an RC-IGCT. However, the turn-off power semiconductor device of the invention has not necessarily to be a RC-IGCT but can be any other kind of turn-off power semiconductor device, such as a reverse blocking IGCT or a gate turn-off thyristor (GTO), having the features of claim 1.

The above embodiments were explained with specific conductivity types. The conductivity types of the semiconductor layers in the above described embodiments might be switched, so that all layers which were described as p-type layers would be n-type layers and all layers which were described as n-type layers would be p-type layers. For example, in a modified first embodiment, the thyristor cells could include a $p^+$-doped cathode semiconductor layer, a n-doped base semiconductor layer, a p-doped drift semiconductor layer, a $p^+$-doped buffer semiconductor layer and a n-doped first anode semiconductor layer.

The material of the anode disk and of the gate ring was described to be molybdenum or a molybdenum copper alloy. However, it is also possible to use other electrically conductive materials.

In the above embodiments of the method for manufacturing the turn-off power semiconductor device it was described to fix the gate ring to the wafer by a bonding technique, such as low temperature bonding, soldering or gluing, after centering the gate ring relative to the wafer and before the molding step. However, it is also possible to hold the wafer temporarily in place, for example by pressing the gate ring against the wafer during molding. After molding and initial cross-linking (hardening) of the rubber, the gate ring remains fixed in position by the rubber ring.

It should be noted that the term "comprising" does not exclude other elements or steps and that the indefinite article "a" or "an" does not exclude the plural. Also elements described in association with different embodiments may be combined.

LIST OF REFERENCE SIGNS 1 reverse conducting IGCT (RC-IGCT)
2 thyristor cell
3 free-wheeling diode
10 wafer
11 first main side
12 second main side
15 termination region
16 active region
20 gate electrode
21 first cathode electrode
22 cathode semiconductor layer
23 base semiconductor layer
24 drift semiconductor layer
25 buffer semiconductor layer
26 first anode semiconductor layer
27 first anode electrode
31 second anode electrode
32 second anode semiconductor layer
33 second cathode semiconductor layer
34 second cathode electrode
40 ring-shaped contact
60 gate ring
61 outer circumferential surface 70 rubber ring
80 anode disk
85 anode pole piece
81 outer side surface
300 ceramic housing
310 cathode contact disk
311 cathode pole piece
315 main cathode contact
316 main anode contact
330 auxiliary cathode lead
340 gate lead
410 top mold part
420 a cylindrical mold part
430 bottom mold part
435 bottom mold part
440 inlet opening
450 outlet opening
C center of the wafer

The invention claimed is:

1. Turn-off power semiconductor device comprising:
a wafer having a first main side, a second main side parallel to the first main side and extending in a lateral direction, an active region and a termination region on the first main side laterally surrounding the active region;
at least one thyristor cell in the active region between the first main side and the second main side, the at least one thyristor cell comprising in the order from the first main side to the second main side:
(a) a first cathode electrode;
(b) a cathode semiconductor layer of a first conductivity type;
(c) a base semiconductor layer of a second conductivity type different from the first conductivity type;
(d) a drift semiconductor layer of the first conductivity type;
(e) an anode semiconductor layer of the second conductivity type;
(f) a first anode electrode,
wherein the at least one thyristor cell further comprises a gate electrode which is arranged lateral to the cathode semiconductor layer and contacting the base semiconductor layer, and
wherein the at least one gate electrode of the at least one thyristor cell is electrically connected to a ring-shaped contact for contacting the at least one gate electrode of the at least one thyristor cell, wherein the ring-shaped contact is formed on the first main side of the wafer in the termination region and surrounds the active region;
the device further comprising:
a rubber ring arranged on the termination region and surrounding the active region; and
an electrically conductive gate ring for contacting the ring-shaped contact from outside, wherein the gate ring is disposed on and electrically connected to the ring-shaped contact within the rubber ring,
wherein an outer circumferential surface of the gate ring is in contact with the rubber ring to define the inner border of the rubber ring,
wherein an upper surface of the gate ring and an upper surface of the rubber ring form a continuous surface extending in a plane parallel to the first main side of the wafer.

2. Turn-off power semiconductor device according to claim 1, wherein the rubber ring overlaps with an outer portion of the ring-shaped contact.

3. Turn-off power semiconductor device according to claim 1, wherein the rubber ring has an outer diameter which is larger than the diameter of the wafer and covers a circumferential side surface of the wafer, which connects the first main side to the second main side.

4. Turn-off power semiconductor device according to claim 1, wherein the gate ring is fixed to the ring-shaped contact by a bonding connection.

5. Turn-off power semiconductor device according to claim 1, wherein the gate ring is made of molybdenum or an molybdenum copper alloy.

6. Turn-off power semiconductor device according to claim 1, further comprising an anode disk which is fixed to the first anode electrode on the second main side of the wafer by a bonding connection.

7. Method for manufacturing a turn-off power semiconductor device, the method comprising the following steps:
a step of providing a wafer having a first main side, a second main side parallel to the first main side and extending a lateral direction, an active region and a termination region on the first main side laterally surrounding the active region, wherein at least one thyristor cell is formed in the active region between the first main side and the second main side, the at least one thyristor cell comprising in the order from the first main side to the second main side:
(a) a first cathode electrode;
(b) a cathode semiconductor layer of a first conductivity type;
(c) a base semiconductor layer of a second conductivity type different from the first conductivity type;
(d) a drift semiconductor layer of the first conductivity type;
(e) an anode semiconductor layer of the second conductivity type;
(f) an first anode electrode,
wherein the at least one thyristor cell further comprises a gate electrode which is arranged lateral to the cathode semiconductor layer and contacting the base semiconductor layer, and wherein the at least one gate electrode of the at least one thyristor cell is electrically connected to a ring-shaped contact for contacting the at least one gate electrode of the at least one thyristor cell, wherein the ring-shaped contact is formed on the first main side of the wafer in the termination region and surrounds the active region;
a step of disposing a gate ring on the ring-shaped contact to electrically connect the gate ring to the ring-shaped contact;
a step of installing the wafer in a mold, wherein the gate ring forms an inner sidewall of the mold; and
a step of molding a rubber ring by injecting liquid rubber into the mold to form a rubber ring arranged on the termination region and surrounding the active region,
wherein injecting the liquid rubber such that an upper surface of the gate ring and an upper surface of the liquid rubber form a continuous surface extending in a plane parallel to the first main side of the wafer.

8. Method according to claim 7, wherein the gate ring is centered to the wafer by a gate-ring centering guide before the molding step.

9. Method according to claim 8, wherein the mold comprises a top mold part and a bottom mold part, wherein the gate ring centering guide is part of the top mold part.

10. Method according to claim 7, wherein the gate ring is fixed to the ring-shaped contact by a bonding technique before the molding step.

11. Method according to claim 7, wherein the gate ring is held in place during the molding step by pressing the gate ring onto the ring-shaped contact.

12. Method according to claim 7, wherein the mold comprises a top mold part and a bottom mold part, and wherein the gate ring and the wafer are clamped between the top mold part and the bottom mold part during the molding step.

13. Turn-off power semiconductor device according to claim 2, wherein the rubber ring has an outer diameter which is larger than the diameter of the wafer and covers a circumferential side surface of the wafer, which connects the first main side to the second main side.

14. Turn-off power semiconductor device according to claim 2, wherein the gate ring is fixed to the ring-shaped contact by a bonding connection.

15. Turn-off power semiconductor device according to claim 1, wherein the rubber ring overlaps with an outer portion of the ring-shaped contact;

wherein the rubber ring has an outer diameter which is larger than the diameter of the wafer and covers a circumferential side surface of the wafer, which connects the first main side to the second main side; and wherein the gate ring is fixed to the ring-shaped contact by a bonding connection.

16. Turn-off power semiconductor device according to claim 2, wherein the gate ring is fixed to the ring-shaped contact by a bonding connection.

17. Turn-off power semiconductor device according to claim 2, further comprising an anode disk which is fixed to the first anode electrode on the second main side-of the wafer by a bonding connection.

18. Method according to claim 8, wherein the gate ring is fixed to the ring-shaped contact by a bonding technique before the molding step.

19. Method according to claim 8, wherein the gate ring is held in place during the molding step by pressing the gate ring onto the ring-shaped contact.

20. Method according to claim 8, wherein the mold comprises a top mold part and a bottom mold part, and wherein the gate ring and the wafer are clamped between the top mold part and the bottom mold part during the molding step.

* * * * *